United States Patent
Carrere et al.

(10) Patent No.: US 11,901,278 B2
(45) Date of Patent: Feb. 13, 2024

(54) ELECTRONIC IC DEVICE COMPRISING INTEGRATED OPTICAL AND ELECTRONIC CIRCUIT COMPONENT AND FABRICATION METHOD

(71) Applicant: STMicroelectronics (Crolles 2) SAS, Crolles (FR)

(72) Inventors: Jean-Pierre Carrere, Grenoble (FR); Francois Guyader, Montbonnot (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 18/095,629

(22) Filed: Jan. 11, 2023

(65) Prior Publication Data

US 2023/0163057 A1 May 25, 2023

Related U.S. Application Data

(62) Division of application No. 17/015,634, filed on Sep. 9, 2020, now Pat. No. 11,581,249.

(30) Foreign Application Priority Data

Sep. 10, 2019 (FR) ...................................... 1909937

(51) Int. Cl.
*H01L 23/495* (2006.01)
*H01L 23/498* (2006.01)
(Continued)

(52) U.S. Cl.
CPC .... *H01L 23/49822* (2013.01); *H01L 21/4857* (2013.01); *H01L 23/49894* (2013.01); *H01L 31/02016* (2013.01)

(58) Field of Classification Search
CPC .......... H01L 23/49822; H01L 21/4857; H01L 23/49894; H01L 31/02016; H01L 27/14634; H01L 27/1469; H01L 27/14636
(Continued)

(56) References Cited

U.S. PATENT DOCUMENTS 9,685,475 B2    6/2017  Guyader et al.
2007/0284685 A1*  12/2007  Tanaka ................ H01L 27/1464
                                                       257/E31.127
(Continued)

OTHER PUBLICATIONS

INPI Search Report and Written Opinion for FR 1909937 dated Apr. 24, 2020 (9 pages).

*Primary Examiner* — Theresa T Doan
(74) *Attorney, Agent, or Firm* — Crowe & Dunlevy

(57) ABSTRACT

A first circuit structure of an electronic IC device includes comprises light-sensitive optical circuit components. A second circuit structure of the electronic IC device includes an electronic circuit component and an electrically-conductive layer extending between and at a distance from the optical circuit components and the electronic circuit component. Electrical connections link the optical circuit components and the electronic circuit component. These electrical connections are formed in holes which pass through dielectric layers and the intermediate conductive layer. Electrical insulation rings between the electrical connections and the conductive layer are provided which surround the electrical connections and have a thickness equal to a thickness of the conductive layer.

18 Claims, 4 Drawing Sheets

(51) Int. Cl.
*H01L 21/48* (2006.01)
*H01L 31/02* (2006.01)

(58) Field of Classification Search
USPC .......................................... 257/666
See application file for complete search history.

(56) References Cited

U.S. PATENT DOCUMENTS

| | | |
|---|---|---|
| 2014/0291481 A1* | 10/2014 | Zhang ................ H01L 27/1463 |
| | | 257/431 |
| 2014/0361347 A1 | 12/2014 | Kao |
| 2015/0221695 A1 | 8/2015 | Park et al. |
| 2018/0261641 A1 | 9/2018 | Maruyama et al. |
| 2019/0067353 A1 | 2/2019 | Tsao et al. |

* cited by examiner

ELECTRONIC IC DEVICE COMPRISING INTEGRATED OPTICAL AND ELECTRONIC CIRCUIT COMPONENT AND FABRICATION METHOD

CROSS REFERENCE TO RELATED APPLICATIONS

This application is a divisional of United States Application for patent Ser. No. 17/015,634, filed Sep. 9, 2020, which claims the priority benefit of French Application for Patent No. 1909937, filed on Sep. 10, 2019, the contents of which are hereby incorporated by reference in their entireties to the maximum extent allowable by law.

TECHNICAL FIELD

The present invention relates to the field of microelectronics and, more particularly, to the field of the electronic integrated circuit devices or electronic integrated circuit chips which comprise external light-sensitive integrated optical circuit components, forming pixel zones, and integrated electronic circuit component such as transistors generally situated under the optical circuit components.

BACKGROUND

There is a difficulty in including and making coexist electrical connections, linking the optical circuit components and the electronic circuit component, and a layer made of an electrically-conductive material or ground plane, so as to effectively prevent a coupling capacitance between the optical circuit components and the electronic circuit component.

SUMMARY

According to one embodiment, an electronic IC device comprises: a first circuit structure comprising light-sensitive optical circuit components; a second circuit structure comprising electronic circuit component and an electrically-conductive layer extending between and at a distance from the optical circuit components and the electronic circuit component; electrical connections configured to link the optical circuit components and the electronic circuit component and formed in holes which pass through dielectric layers and the conductive layer, and electrical insulation rings between the conductive layer and the electrical connections and formed around the electrical connections and in the thickness of the conductive layer.

Thus, the conductive layer can extend to close to the electrical connections and the electrical insulation rings can be reduced, so that any coupling capacitance between the optical circuit components and the electronic circuit component can be avoided.

The electrical insulation rings can be composed of portions of the conductive layer, rendered dielectric.

The conductive layer can be made of doped polysilicon and the electrical insulation rings can be made of oxidized doped polysilicon.

The first circuit structure can comprise, in succession, between an outer rear face and a front mounting face, a substrate layer provided on the side of the mounting face with said optical circuit components and a dielectric layer.

The second circuit structure can comprise, in succession, from a mounting face attached to the mounting face of the first circuit structure, a first dielectric layer including said conductive layer, a local substrate layer provided with said electronic circuit component and having through-openings and a second dielectric layer comprising parts filling these through-openings.

Said electrical connections can be formed in holes which pass through the dielectric layers of the second circuit structure, by passing through the openings of the substrate layer of this second circuit structure and at a distance from the edges of these openings, the conductive layer and the dielectric layer of the first circuit structure, to electrical contacts of the optical circuit components of the first circuit structure.

The electronic IC device can comprise electrical connections formed in holes which pass through the second dielectric layer of the second circuit structure, to electrical contacts of the electronic circuit component of the second circuit structure.

The electronic IC device can comprise an additional dielectric layer including a network of electrical connections selectively linking said electrical connections and outer electrical contacts formed in a face of the additional dielectric layer opposite said second dielectric layer.

The electronic IC device can comprise a third circuit structure attached to the second circuit structure and including electronic circuit component linked to said network of electrical connections.

There is also proposed a method for fabricating an electronic IC device, which comprises: fabricating a first circuit structure comprising, in succession, between an outer face and a mounting face, a substrate layer provided on the side of the mounting face with light-sensitive optical circuit components and a dielectric layer; fabricating, separately from the first circuit structure, a part of a second circuit structure comprising, in succession, between a mounting face, a first dielectric layer including an intermediate electrically-conductive layer, and a local substrate layer; assembling the first circuit structure and said part of the second circuit structure by attaching the mounting face of the first circuit structure and the mounting face of the second circuit structure; producing electronic circuit component on the substrate layer of the second circuit structure and through-openings through this substrate layer; producing a second dielectric layer above the substrate layer of the second circuit structure, this second layer filling said openings to the first dielectric layer; producing holes through the dielectric layers of the second circuit structure, by passing through the openings of the substrate layer of this second circuit structure and at a distance from the edges of these openings, the conductive layer and the dielectric layer of the first circuit structure, to electrical contacts of the optical circuit components of the first circuit structure; producing electrical insulation rings by a transformation of portions of the conductive layer, adjacent to the holes, via said holes; and filling said holes with an electrically-conductive material so as to form electrical connections linked to the electrical contacts of the optical circuit components of the first circuit structure.

The method can comprise: producing holes through the second dielectric layer of the second circuit structure to electrical contacts of the electronic circuit component; and filling these holes with an electrically-conductive material so as to form electrical connections linked to the electrical contacts of the electronic circuit component of the second circuit structure.

The method can comprise: producing, above the second dielectric layer of the second circuit structure, an additional dielectric layer including networks of electrical connections selectively linking said electrical connections and outer electrical contacts of an outer face of the additional dielectric layer.

The method can comprise: mounting a third circuit structure above the additional dielectric layer of the second circuit structure, by linking electronic circuit component of this third circuit structure to said networks of electrical connections via said outer electrical contacts.

The conductive layer can be made of doped polysilicon and the electrical insulation rings can be obtained by oxidation of the portions of this layer, adjacent to said holes.

The oxidation can be obtained by thermal or plasma oxidation.

BRIEF DESCRIPTION OF THE DRAWINGS

An electronic IC device including optical circuit components and electronic circuit component will now be described by way of non-limiting exemplary embodiment, illustrated by the drawings in which.

DETAILED DESCRIPTION

Figure 1:
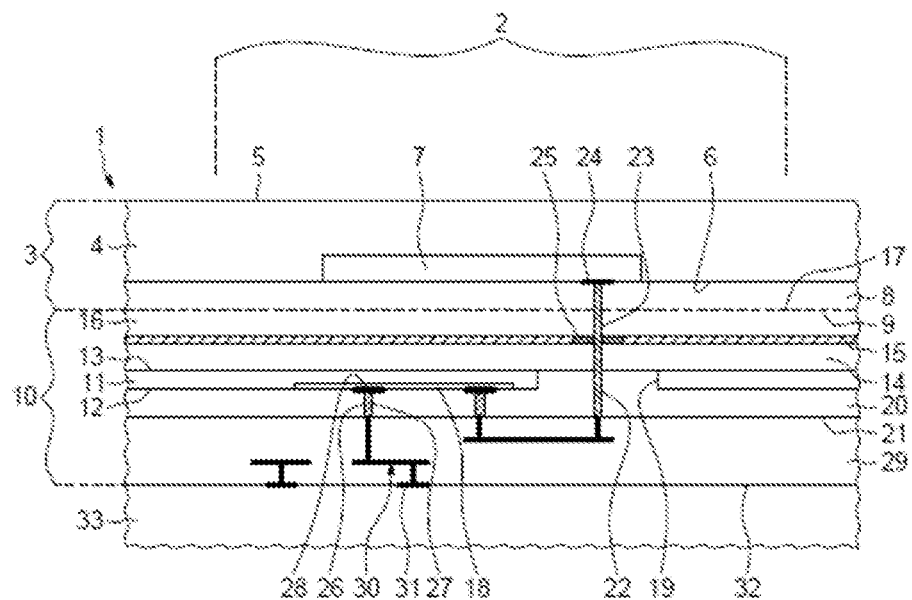
FIG. 1 shows a cross section of an electronic IC device.

According to an embodiment illustrated in FIG. 1, an electronic integrated circuit (IC) device 1, or electronic IC chip, comprises a plurality of adjacent zones of pixels 2.

The electronic IC device 1 comprises a first circuit structure 3 which comprises a substrate layer 4, made of silicon, which has an outer rear face 5 and a front face 6 opposite this rear face 5.

The front face 6 of the substrate layer 4 is provided, in the zones of pixels 2, with integrated optical circuit component 7 which are sensitive to the light passing through the rear face 4 so as to deliver electrical signals as a function of the light.

The first circuit structure 3 comprises, above the front face 6, a dielectric encapsulation layer 8, for example made of silicon oxide, which has a front mounting face 9.

The electronic IC device 1 comprises a second circuit structure 10 which comprises a local substrate layer 11, for example made of silicon, which has a front face 12 and a rear face 13 on the side of the first circuit structure 3.

Between the rear face 13 of the substrate layer 11 and the mounting face 9 of the first circuit structure 3, the second circuit structure 10 comprises a dielectric layer 14 above the rear face 13 of the substrate layer 11, then an intermediate electrically-conductive layer 15, or ground plane, above the dielectric layer 14, then a dielectric layer 16 above the conductive layer 14, this dielectric layer 16 having a rear mounting face 17 attached to the front mounting face 9 of the first circuit structure 3.

The dielectric layers 14 and 16 are, for example, made of silicon oxide and the conductive layer 15, or ground plane, is, for example, made of doped polysilicon.

The front face 12 of the substrate layer 11 is provided, in the zones of pixels 2, with integrated electronic circuit components 18, including transistors, formed on local portions of the substrate layer 11, this substrate layer 11 having openings 19.

The result of the above is that the conductive layer 15 extends between and at a distance from the optical circuit components 7 and the electronic circuit components 18.

The second circuit structure 10 comprises, above the front face 12 of the substrate layer 11, a dielectric encapsulation layer 20, for example made of silicon oxide, this dielectric layer 20 filling the openings 19 to the dielectric layer 14 and having a front face 21.

The electronic IC device 1 comprises, in the zones of pixels 2, a plurality of electrical connections 22 which are formed in holes 23 which extend between the front face 21 of the dielectric layer 20 and front electrical contacts 24 of the electronic circuit component 7 of the first circuit structure 3 and which pass through the dielectric layer 20, through and at a distance from the flanks of the openings 19 of the substrate layer 11, the dielectric layer 16, the conductive layer 15 and the dielectric layer 8.

The electrical connections 22 are electrically insulated from the conductive layer 15 by virtue of electrical insulation rings 25 which surround the electrical connections 22 and which are distinct from the dielectric layers 14 and 16. The electrical insulation rings 25 are formed in the thickness of the conductive layer 15.

In particular, the electrical insulation rings 25 are composed of reduced local annular portions of the conductive layer 15 surrounding the electrical connections 22, these local portions being rendered dielectric.

For example, where the conductive layer 15 is made of doped polysilicon, the electrical insulation rings 25 are made of oxidized doped polysilicon.

The electronic IC device 1 comprises, in the zones of pixels 2, a plurality of electrical connections 26 which are formed in holes 27 which extend between the front face 21 of the dielectric layer 20 and the front electrical contacts 28 of the electronic circuit components 18 of the second circuit structure 3 and which pass through the dielectric layer 20.

The second circuit structure 10 of the electronic IC device 1 comprises a front dielectric layer 29 above the front face 21 of the dielectric layer 20.

The front dielectric layer 29 includes, in the zones of pixels 2, networks of electrical connections 30 configured so as to selectively link the electrical connections 22 and 25 and outer front contacts 31 formed in a front face 32 of the front dielectric layer 29.

More particularly, the networks of electrical connections 30 are configured so as to ensure, in the zones of pixels 2, electrical links between the optical circuit components 7 and the electronic circuit components 18, which convert the electrical signals from the optical circuit components 7, and electrical links between the electronic circuit components 18 and the front electrical contacts 31 to deliver the converted electrical signals.

Moreover, the conductive layer 15 can be linked to the ground by electrical connections, not represented, formed in holes passing through the dielectric layers 11, 14 and 20 and linked to the networks of electrical connections 30.

The electronic IC device further comprises a third circuit structure 33, not detailed in the figure, which is attached to the front face 33 of the layer 29 of the second circuit structure 10.

This third circuit structure 33 comprises electronic circuit components, notably transistors, which are linked to the electrical contacts 31 and which are capable of processing the electrical signals coming from electronic circuit components 18 of the second circuit structure 10 via the networks of electrical connections 30.

The electronic IC device 1 can be fabricated according to the following steps.

Figure 2:
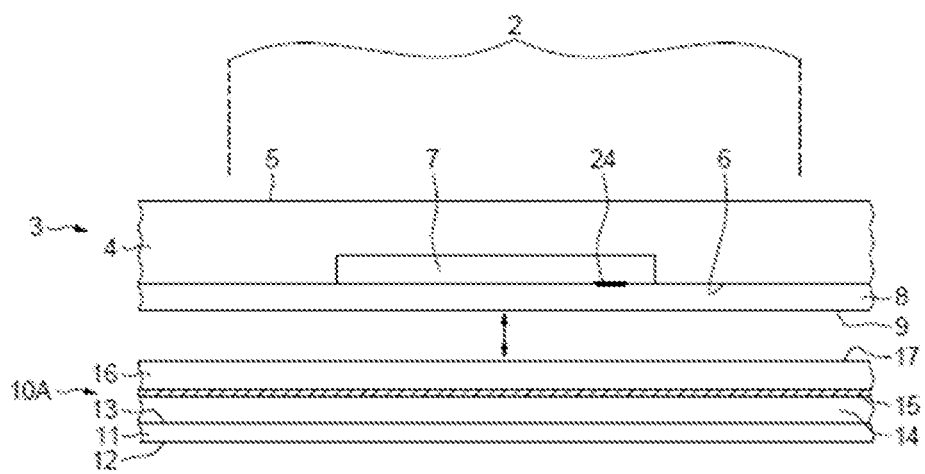
FIGS. 2-7 show steps of fabrication of the electronic IC device of FIG. 1.

As illustrated in FIG. 2, on the one hand, there is completed the first circuit structure 3, the dielectric layer 8 being integral. Advantageously, the substrate layer 4 is thick.

On the other hand, there is a completed part 10A of the second circuit structure 10, this completed part 10A comprising the integral substrate layer 20, not provided with the openings 19 and not provided with the electronic circuit components 18, the integral dielectric layer 14, the integral conductive layer 15 and the integral dielectric layer 16.

The adjective "integral" means that the abovementioned layers are not provided with any holes.

The first circuit structure 3 is assembled by attaching the mounting face 9 of the dielectric layer 8 and the mounting face 17 of the dielectric layer 16.

Figure 3:
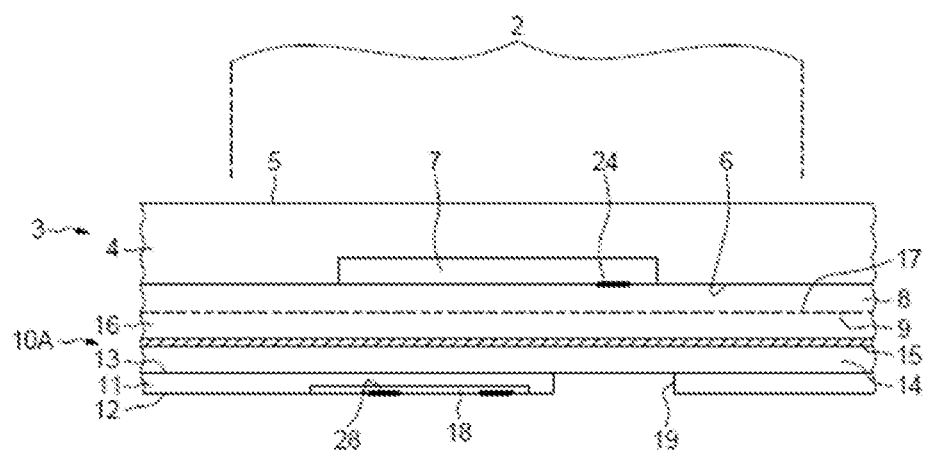

After which, as illustrated in FIG. 3, the electronic circuit components 18 are produced on the front face 12 of the substrate layer 11, and the openings 19 are produced through the substrate layer 11, in that order, or in the other order.

Figure 4:
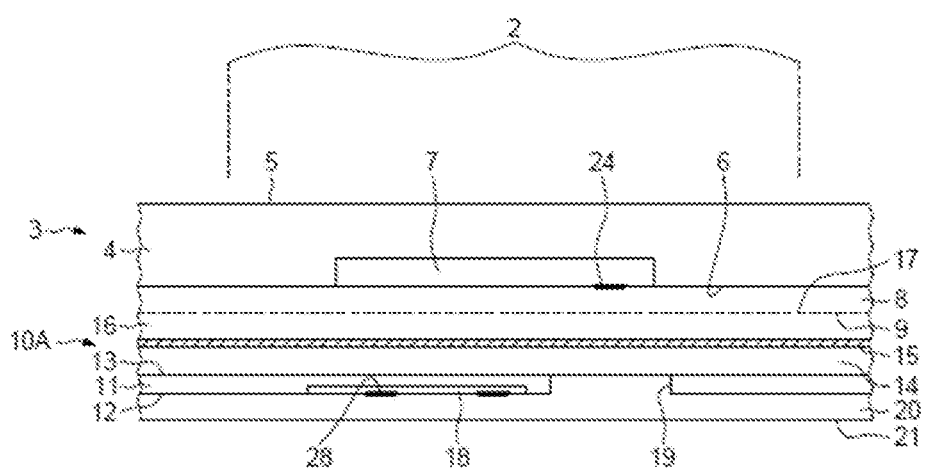

After which, as illustrated in FIG. 4, the dielectric layer 20 is produced above the substrate layer 11, this layer 20 filling the openings 19 of the substrate layer 11 to the dielectric layer 14.

Figure 5:
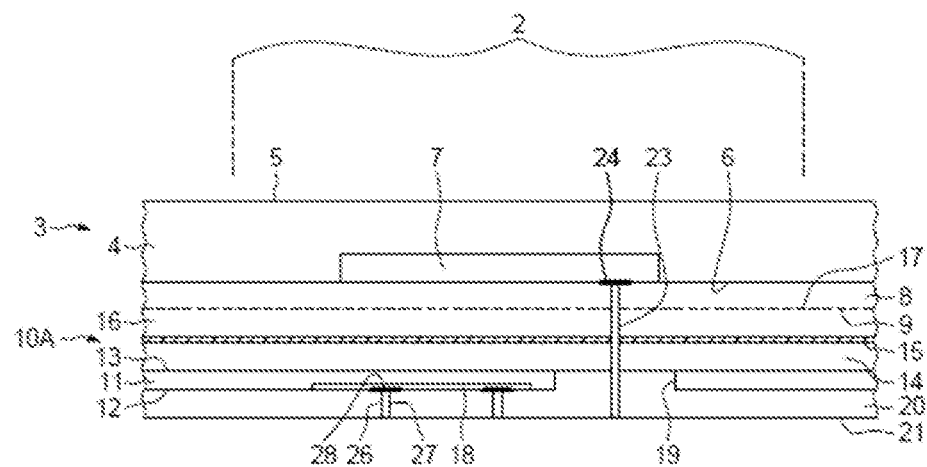

After which, as illustrated in FIG. 5, the holes 23 and 27 are produced by etching.

Figure 6:
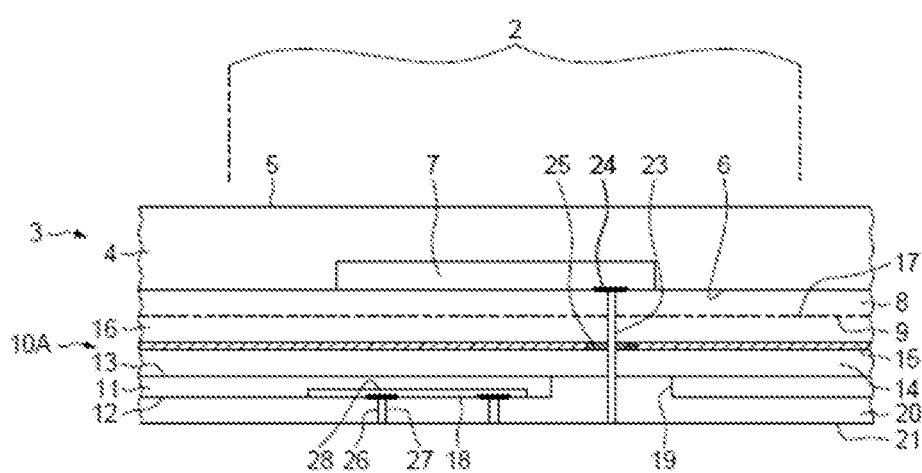

Then, as illustrated in FIG. 6, the portions of the conductive layer 15 adjacent to the holes 23 are transformed into a dielectric material, via the holes 23.

For example, where the conductive layer 15 is made of doped polysilicon, an oxidation gas is introduced into the holes 23 so that, by thermal or plasma oxidation, the annular portions surrounding the holes 23 of the oxidation layer 15 are transformed into dielectric oxidized doped polysilicon and form the electrical insulation rings 25.

Figure 7:
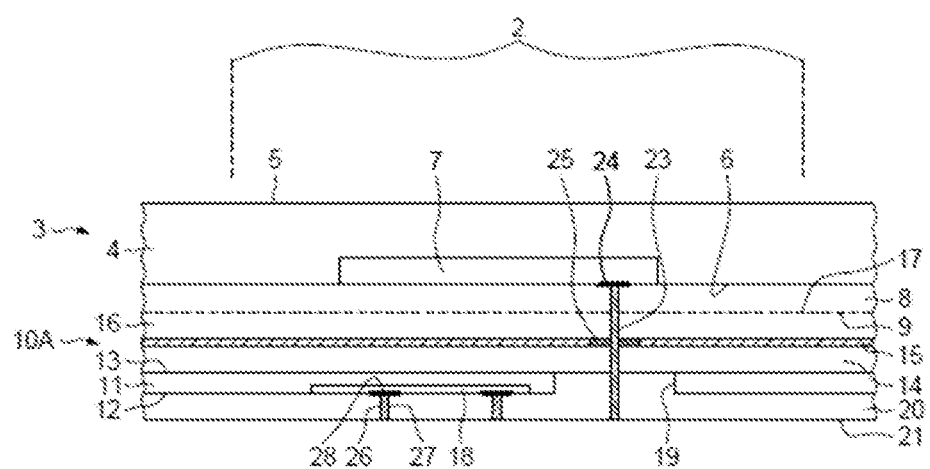

After which, as illustrated in FIG. 7, the holes 23 and 27 are filled with an electrically-conductive material so as to produce the electrical connections 22 and 26, this material being, for example, tungsten.

According to a variant embodiment, on the one hand the holes 23 and the electrical connections 22 filling them and on the other hand the holes 27 and the electrical connections 26 filling them can be produced according to distinct steps.

After which, the dielectric layer 29 provided with the networks of electrical connections 30 is produced.

The electronic IC device 1 illustrated in FIG. 1 is then obtained, without the third circuit structure 33.

After which, the third circuit structure 33 is assembled on the face 32 of the second circuit structure 10.

After which, the back of the substrate layer 4 of the first circuit structure 3 is thinned, so that the light appropriately reaches the optical circuit components 7.

The electronic IC device 1 can be fabricated by implementing the means and the procedures used routinely in the field of microelectronics.

As an indication, the thicknesses of the different layers can be as follows.

The thickness of the substrate layer 4 can be approximately four micrometers.

The thickness of the dielectric layer 8 can be approximately two hundred nanometers.

The thickness of the substrate layer 11 can be approximately twenty-five nanometers.

The thickness of the dielectric layer 14 can be approximately twenty-five nanometers.

The thickness of the conductive layer 15 can be approximately thirty nanometers.

The thickness of the dielectric layer 16 can be approximately twenty nanometers.

The thickness of the dielectric layer 20 can be approximately three hundred nanometers.

The thickness of the dielectric layer 29 including the networks of electrical connections 30 can be approximately three micrometers.

The result of the above is that the electronic IC device 1 obtains the following advantages.

The conductive layer 15 forming a ground plane, because of its large surface area going as far as short distances from the electrical connections 22, effectively prevents any capacitive coupling between the optical circuit components 7 and the electronic circuit components 18.

The electrical connections 22 linking the optical circuit components 7 and the electronic circuit components 18 are produced through only the dielectric layers 8, 14 and 20 and the conductive layer 15.

The electrical insulation between the conductive layer 15 and the electrical connections 22, via the electrical insulation rings 25 resulting from a local transformation of the conductive layer 15 into reduced dielectric portions, is produced simply via the holes 23, before the filling of these holes 13 to obtain the electrical connections 22.

The invention claimed is:

1. A method for manufacturing an electronic integrated circuit (IC) device, comprising:
    fabricating a first circuit structure comprising, in succession, between an outer face and a mounting face: a substrate layer provided on the side of the mounting face with light-sensitive optical circuit components and a dielectric layer;
    fabricating, separately from the first circuit structure, a part of a second circuit structure comprising, in succession, between a mounting face and a front face: a first dielectric layer including an intermediate electrically-conductive layer, and a local substrate layer;
    assembling the first circuit structure and said part of the second circuit structure by attaching the mounting face of the first circuit structure and the mounting face of the second circuit structure;
    producing through-openings which extend through the local substrate layer of the second circuit structure;
    producing a second dielectric layer above the local substrate layer of the second circuit structure, wherein the second dielectric layer fills said through-openings;
    producing holes extending through the first and second dielectric layers and which pass through said through-openings in the local substrate layer of the second circuit structure and at a distance from edges of the through-openings, and also pass through the intermediate electrically-conductive layer and further pass through the dielectric layer of the first circuit structure, said holes extending to reach electrical contacts of the light-sensitive optical circuit components of the first circuit structure;
    transforming portions of the intermediate electrically-conductive layer, located adjacent to the holes, to produce electrical insulation rings surrounding the holes; and
    filling said holes with an electrically-conductive material so as to form electrical connections linked to the electrical contacts of the light-sensitive optical circuit components of the first circuit structure.

2. The method according to claim 1, further comprising producing an electronic circuit component on the local substrate layer at said front face of the second circuit structure.

3. The method according to claim 2, further comprising:
producing holes through the second dielectric layer of the second circuit structure to reach electrical contacts of the electronic circuit component; and
filling the holes with an electrically-conductive material so as to form electrical connections linked to the electrical contacts of the electronic circuit component of the second circuit structure.

4. The method according to claim 1, further comprising:
producing, above the second dielectric layer of the second circuit structure, an additional dielectric layer including networks of electrical connections selectively linking said electrical connections and outer electrical contacts of an outer face of the additional dielectric layer.

5. The method according to claim 4, further comprising:
mounting a third circuit structure above the additional dielectric layer of the second circuit structure; and
linking an electronic circuit component of the third circuit structure to said networks of electrical connections via said outer electrical contacts.

6. The method according to claim 1, wherein transforming comprises applying a material transformation process to said portions of the intermediate electrically-conductive layer through said holes.

7. The method according to claim 6, wherein the intermediate electrically-conductive layer is made of doped polysilicon and wherein the material transformation process comprises an oxidation of said portions of the intermediate electrically-conductive layer.

8. The method according to claim 7, wherein the oxidation comprises a thermal oxidation through said holes.

9. The method according to claim 7, wherein the oxidation comprises a plasma oxidation through said holes.

10. A method for manufacturing an electronic integrated circuit (IC) device, comprising:
fabricating a circuit structure comprising, in succession, between an outer face and a front face, a substrate layer including light-sensitive optical circuit components, a first dielectric layer, an intermediate electrically-conductive layer, a second dielectric layer, and a local substrate layer;
producing through-openings which extend through the local substrate layer;
producing a third dielectric layer above the local substrate layer, wherein the third dielectric layer fills said through-openings;
producing holes extending through the first, second and third dielectric layers and which pass through said through-openings in the local substrate layer at a distance from edges of the through-openings, and also pass through the intermediate electrically-conductive layer, said holes extending to reach electrical contacts of the light-sensitive optical circuit components;
transforming portions of the intermediate electrically-conductive layer, located adjacent to the holes, to produce electrical insulation rings surrounding the holes; and
filling said holes with an electrically-conductive material so as to form electrical connections linked to the electrical contacts of the light-sensitive optical circuit components.

11. The method according to claim 10, further comprising producing an electronic circuit component on the local substrate layer at said front face.

12. The method according to claim 11, further comprising:
producing holes through the second dielectric layer to reach electrical contacts of the electronic circuit component; and
filling the holes with an electrically-conductive material so as to form electrical connections linked to the electrical contacts of the electronic circuit component.

13. The method according to claim 10, further comprising:
producing, above the third dielectric layer, an additional dielectric layer including networks of electrical connections selectively linking said electrical connections and outer electrical contacts of an outer face of the additional dielectric layer.

14. The method according to claim 13, further comprising:
mounting a further circuit structure above the additional dielectric layer; and
linking an electronic circuit component of the further circuit structure to said networks of electrical connections via said outer electrical contacts.

15. The method according to claim 10, wherein transforming comprises applying a material transformation process to said portions of the intermediate electrically-conductive layer through said holes.

16. The method according to claim 15, wherein the intermediate electrically-conductive layer is made of doped polysilicon and wherein the material transformation process comprises an oxidation of said portions of the intermediate electrically-conductive layer.

17. The method according to claim 16, wherein the oxidation comprises a thermal oxidation through said holes.

18. The method according to claim 16, wherein the oxidation comprises a plasma oxidation through said holes.

* * * * *